United States Patent [19]

Reese, Jr. et al.

[11] Patent Number: 4,780,667
[45] Date of Patent: Oct. 25, 1988

[54] MAGNETOSTATIC WAVE DELAY LINE DISCRIMINATOR WITH AUTOMATIC QUADRATURE SETTING AND AUTOMATIC CALIBRATION

[75] Inventors: Elias Reese, Jr., Santa Rosa; Waguih Ishak, Cupertino; Matthew A. Fowler; Thomas A. Jerse, both of Santa Rosa, all of Calif.

[73] Assignee: Hewlett-Packard Company, Palo Alto, Calif.

[21] Appl. No.: 748,516

[22] Filed: Jun. 25, 1985

[51] Int. Cl.[4] ..................... G01R 25/00; H03D 13/00
[52] U.S. Cl. .............. 324/83 FE; 324/83 Q; 333/201; 328/133
[58] Field of Search ............. 324/57 N, 57 Q, 82, 324/83 Q, 83 D, 83 A, 83 FE, 81, 84; 333/201, 203, 148; 328/133

[56] References Cited

U.S. PATENT DOCUMENTS

| | | | |
|---|---|---|---|
| 4,002,969 | 1/1977 | Barley et al. | 324/57 |
| 4,002,970 | 1/1977 | Ashley et al. | 324/57 |
| 4,002,971 | 1/1977 | Rast, Jr. et al. | 324/57 |
| 4,451,782 | 5/1984 | Ashida | 324/83 A |
| 4,533,873 | 8/1985 | Alcock | 328/133 |

FOREIGN PATENT DOCUMENTS

| | | | |
|---|---|---|---|
| 1516182 | 4/1969 | Fed. Rep. of Germany | 324/83 A |
| 1257319 | 2/1970 | United Kingdom | 324/83 Q |

OTHER PUBLICATIONS

Owens; "Two Port Magnetostatic Wave Resonator . . . " IEEE MW Symposium–Jun. 1978.
Labaar; "New Discriminator Boosts Phase Noise Testing", Microwaves–Mar. 1982.

Primary Examiner—Reinhard J. Eisenzopf
Assistant Examiner—Jose M. Solis
Attorney, Agent, or Firm—John A. Frazzini

[57] ABSTRACT

A discriminator having a power divider that divides a signal under test into a signal channel component and a reference channel component. A tunable delay line, such as a magnetostatic wave delay line, inserts a delay into the reference channel. A multielement input transducer selects a narrow band of spin wave wavelengths that are activated, thereby producing frequency discrimination. A phase detector is responsive to both channels to produce an output signal to a spectrum analyzer. A feedback loop, responsive to the output signal of the phase detector automatically places these two components into a quadrature relationship. The discriminator is automatically calibrated by tuning the delay line to values away from the quadrature condition in order to determine the discriminator consant.

3 Claims, 6 Drawing Sheets

MAGNETOSTATIC WAVE DELAY LINE DISCRIMINATOR WITH AUTOMATIC QUADRATURE SETTING AND AUTOMATIC CALIBRATION

BACKGROUND OF THE INVENTION

The disclosed invention relates in general to frequency discriminators suitable for use in measuring phase noise in tunable ocsillators and more particularly to frequency discriminators utilizing delay lines. Measuring and specifying phase noise has become increasingly important as phase noise is the limiting factor in many RF and microwave systems like Doppler radar and space telemetry systems and communication links. Several different types of frequency discriminators have been developed including lumped resonators for the UHF band, transmission lines for the VHF, UHF and microwave bands and waveguide stubs and cavity resonators for the high microwave band. Of these schemes, the transmission line discriminators exhibit the best dynamic range for practical phase noise measurements. Such discriminators are disclosed in U.S. Pat. Nos. 4,002,969 issued to Barley et al on Jan. 11, 1977, 4,002,970 issued to Ashley et al on Jan. 11, 1977 and 4,002,971 issued to Rast et al on Jan. 11, 1977.

In these transmission line discriminators, a signal under test is divided by a power divider into a signal channel component and a power channel component, each of which is applied to an input of a mixer. A transmission line is included in the signal channel between the power divider and the mixer to convert frequency fluctuations into phase fluctuations. The output signal from the mixer has components at the sum and at the difference of the frequencies of the signal under test. The components at the sum of the frequencies are discarded by a filter or by the inherent bandwidth of the circuit elements that are responsive to the output of the mixer so that only the difference signal (referred to herein as the intermediate frequency or IF component) is used to observe the phase noise. For a single frequency carrier signal under test having some frequency noise (converted to phase noise by the delay line), the resulting output signal has a DC component proportional to the square of the carrier signal, an AC component proportional to the phase noise and some negligible AC components proportional to higher powers of the phase noise. The DC component is eliminated by assuring that the signal channel component and the power channel component are in quadrature (i.e., are ninety degrees out of phase plus additional phase variations due to the phase noise). The proportionality constant (known as the discriminator constant) between the AC component of the mixer output signal and the frequency noise signal is determined by a calibration of the discriminator.

These transmission line discriminators, when used for phase noise measurements in the VHF and UHF bands, require a variable phase shifter in either the signal channel or the reference channel to obtain quadrature between the reference path and the delayed signal path. This phase shifter adds both expense and noise to the discriminator. In addition, the calibration procedure to determine the discriminator constant is lengthy and usually involves controlled known frequency modulation of the signal under test, thereby requiring extra equipment including an extra signal source. For maximum discriminator sensitivity, there exists an optimum transmission line length which gives a total loss of 8.7 dB. At 500 MHz, this is equivalent to about 70 meters of excellent quality coaxial cable allowing about 300 nanoseconds of delay. Because loss increases with frequency, transmission line discriminators cannot be used for measuring phase noise on carrier frequencies above 5 GHz. Furthermore, because transmission line discriminators have to be calibrated at different frequencies, they are impractical to use for phase noise measurements of tunable oscillators.

SUMMARY OF THE INVENTION

In accordance with the illustrated preferred embodiment, a frequency discriminator is presented that is suitable for use in measuring frequency noise of a tunable oscillator that produces frequencies up to several gigahertz. A signal under test is divided by a power divider into a signal component and a reference component each of which is applied to an input of a mixer. A magnetostatic wave delay line is inserted into one of these channels to produce a controllable delay into that channel before application of that channel component to the mixer. The output signal of the mixer is filtered by a low pass filter and amplified by a low noise amplifier before being applied to a spectrum analyzer for observation of the noise signal.

The magnetostatic wave delay line is responsive to the magnetic field from an electromagnetic coil to select the frequency response produced by the magnetostatic wave delay line. The current to the coil is determined by control circuitry that is responsive to the output signal of the mixer and to commands from a computer. Such control circuitry introduces a narrowband feedback loop to control the magnetic field applied to the magnetostatic wave delay line. This arrangement enables the magnetostatic wave delay line to automatically set the signal and reference channel components into quadrature. In addition, the computer controls the control circuitry to tune the magnetostatic wave delay line slightly above and then slightly below the quadrature point, thereby enabling the discriminator constant to be quickly and easily determined. This enables the discriminator to be calibrated without requiring an additional signal source for production of a known frequency modulation of the signal under test. This also enables the discriminator to be calibrated over a wide frequency range, making it attractive for use with turnable oscillators that operate up to several GHz.

It is a common practice in phase noise measurements to look for frequency fluctuations up to about 20 MHz from the carrier frequency. In most measuring configurations, an input bandpass filter is used to eliminate signals outside this 20 MHz range. In the case of the magnetostatic wave discriminator, this filter can be eliminated because the delay line can be designed to have a 20 MHz bandwidth at any carrier frequency within the tuning range.

DESCRIPTION OF THE PREFERRED EMBODIMENT

Figure 1:
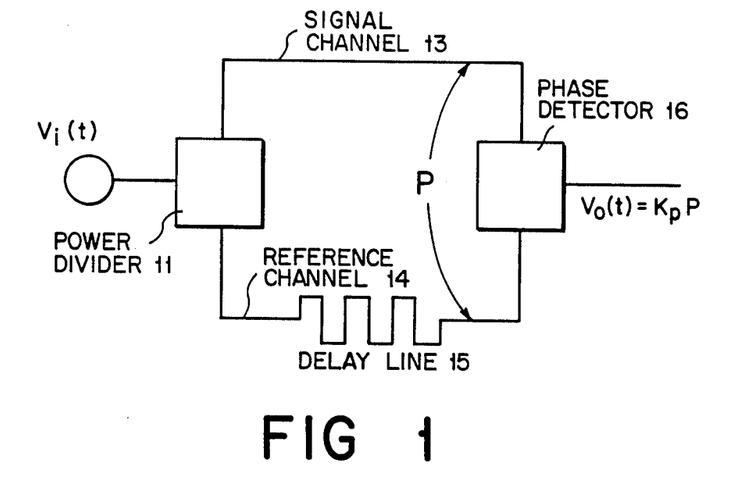
FIG. 1 is a block diagram of a delay line frequency discriminator.

In the following discussion, the first digit of a reference numeral indicates the first figure in which the element designated by the reference numeral is discussed. In FIG. 1 is illustrated the operation of a delay line frequency discriminator. A signal under test $V_i(t)$ is divided by a power divider 11 into a signal channel component that travels to a first input of a phase detector 12 along a signal channel 13 and into a reference channel component that travels to a second input of a phase detector 12 along a reference channel 14. A delay line 15 is located in the reference channel to insert a delay D in the signal in that path. The output signal $V_o(t)$ of the phase detector is proportional to the cosine of the phase difference P between the reference channel component and the signal channel component. The proportionality constant is designated as $K_p$.

When $V_i(t)$ consists of a carrier signal of frequency $f_o$ and frequency noise of magnitude F and frequency f, then the frequency of $V_i(t)$ is $f(t) = f_o + F\sin(2\pi ft)$. For this signal, the phase difference P between the reference channel component and the signal channel component is:

$$P = [2\pi f_o(t - D) + (F/f)\cos(2\pi f(t - D))] - [2\pi f_o t + (F/f)\cos(2\pi ft)] \quad (1)$$
$$= -2\pi f_o D + (F/f)[\cos(2\pi f(t - D)) - \cos(2\pi ft)]$$
$$= -2\pi f_o D + 2(F/f)\sin(\pi fD)\sin(2\pi f(t - D/2)).$$

In general, F is small so that the expression for $V_o(t)$ can be expanded to first order in F to give a DC component and a component that is linear in F. To this order, $V_o(t)$ is equal to:

$$AK_p[\cos(2\pi f_o D) + \sin(2\pi f_o D)(2F/f)\sin(\pi fD)\sin(2\pi f(t - D/2))] \quad (2)$$

where A is the amplitude of the signal under test $V_i(t)$. The DC component vanishes when delay D is an odd multiple of $\frac{1}{4}f_o$ so that the signal channel component and the reference channel component are in quadrature. When D is an odd multiple of $\frac{1}{4}f_o$, $V_o(t)$ is equal to:

$$-AK_p \sin[2(F/f)\sin(\pi fD)\sin(2\pi f(t - D/2))] \quad (3)$$

which, for small values of F/f, is approximately equal to $$-AK_p 2(F/f)\sin(\pi fD)\sin(2\pi f(t - D/2)) \quad (4)$$

Because of the $\sin(\pi fD)$ factor, the delay D can be determined in a calibration measurement in which the carrier signal frequency $f_o$ is modulated at a controlled known frequency f. Frequency f is then varied between two successive values $f_1$ and $f_2$ where $\sin(\pi fD)$ vanishes so that D can be calculated as $D = 1/(f_2 - f_1)$. The delay of the delay line can also be measured directly by a spectrum analyzer. During measurements of frequency noise, f is typically less than $\frac{1}{2}D$ so that the $\sin(\pi fD)$ factor can be approximated by $\pi fD$. For such values of f, we can rewrite $V_o(t)$ as:

$$V_o(t) = K_D F \sin(2\pi f(t - D/2)) \quad (5)$$

where $K_D = AK_p 2\pi D$ is the discriminator constant.

Figure 2:
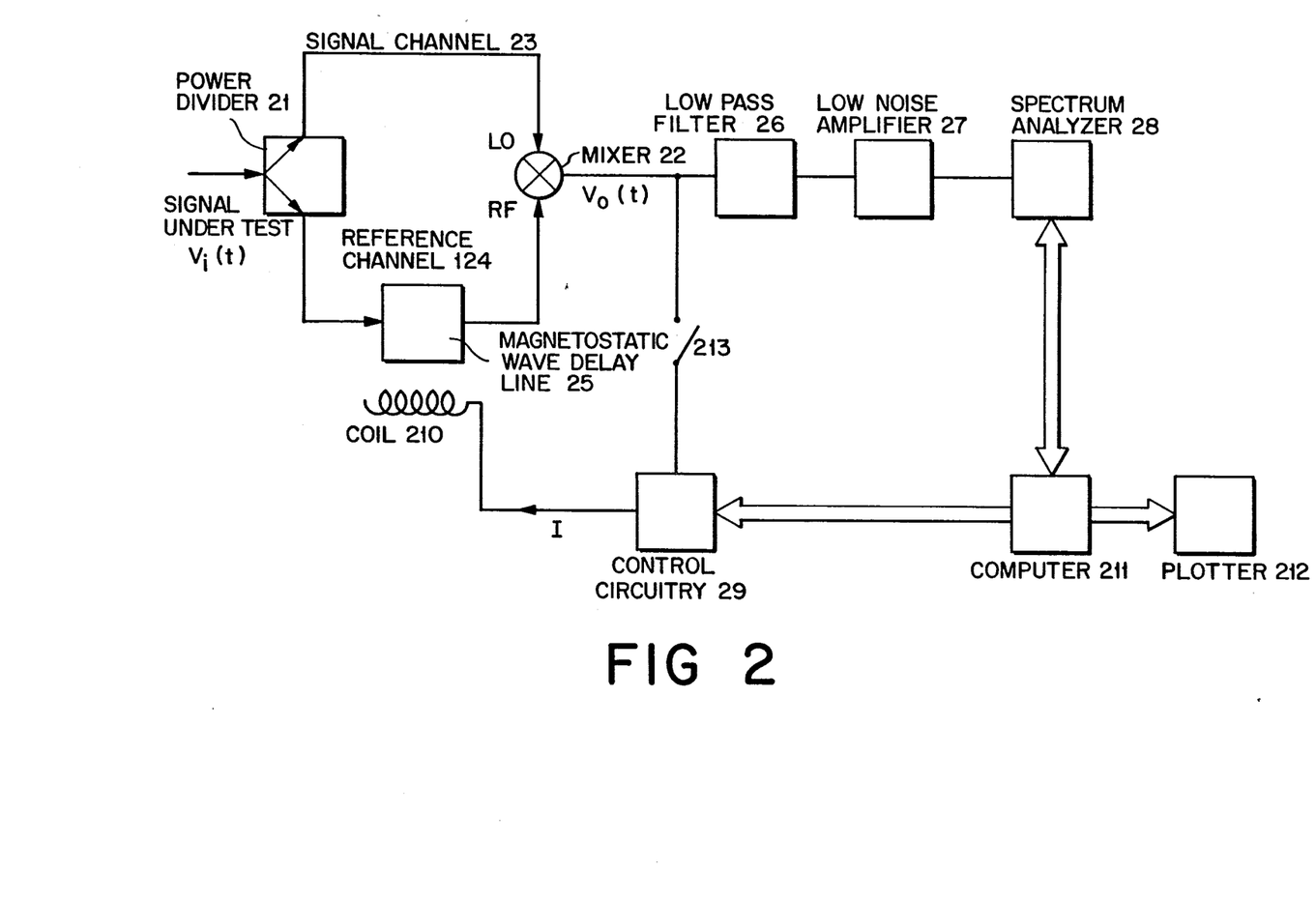
FIG. 2 is a block diagram of a preferred embodiment of the wideband magnetostatic wave delay line discriminator with automatic quadature setting and automatic calibration.

In FIG. 2 is shown a block diagram of a preferred embodiment of the wideband magnetostatic wave delay line scriminator with automatic quadrature setting and automatic calibration. A signal under test $V_i(t)$ is applied to the input of a power divider 21 which divides the signal under test into a signal channel component that is applied to the LO input of a mixer 22 via a signal channel 23 and into a reference channel component that is applied to the RF input of mixer 22 via a reference channel 24. A magnetostatic wave delay line 25 is located in the reference channel to convert frequency variations into phase variations, to act as a frequency discriminator, and to place the reference channel component into quadrature with the signal channel component. Dielectric resonators could also be used as the tunable delay line in place of the magnetostatic wave delay line, they are less attractive because dielectric resonators are tunable only over a range of about 10% of the center frequency of such a resonator. The delay line could be placed in either channel, but most mixers require a greater amount of power into the LO input than into the RF input so that it is advantageous to place the delay line in the channel connected to the RF input of the mixer.

Magnetostatic wave delay lines are discussed by Waguih S. Ishak and Kok-Wai Chang in an article entitled "Magnetostatic-Wave Devices for Microwave Signal Processing" published in the February 1985 issue of the Hewlett-Packard Journal on page 10 and an example is presented in FIG. 3. In such a delay line, a thin film 31 of ferrimagnetic material is brought into contact with a substrate 32. An electromagnet 33 driven by a coil 34 applies an external magnetic field that aligns the magnetic dipoles in ferrimagnetic film 31. A thin strip 35 of conductive material serves as an input transducer and a thin strip 36 of conductive material serves as an output transducer. When a current is applied to input transducer 35, that current produces a magnetic field that launches a spin wave down the film of ferrimagnetic material. When that wave reaches output transducer 36, a current is induced in the output transducer. The direction of the bias field shown in FIG. 3 results in magnetostatic surface wave propagation. If the bias field is applied normal to the plane of the ferrimagnetic film 31, magnetostatic volume waves will be propagated.

Figure 3:
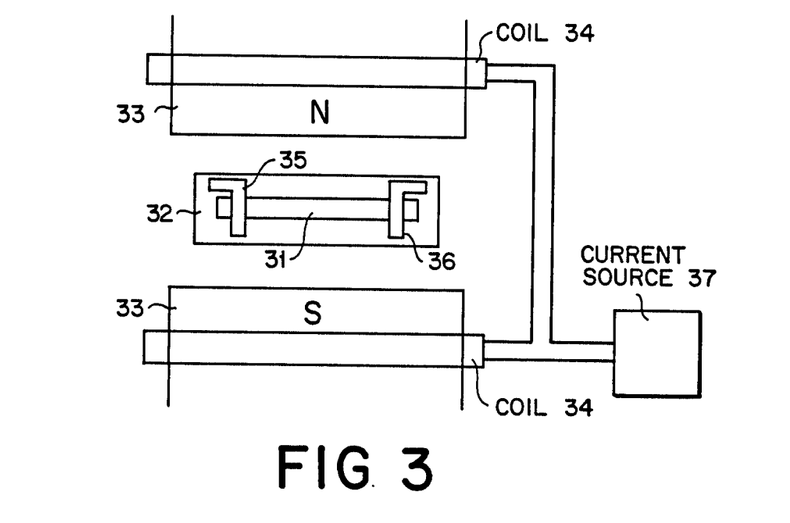
FIG. 3 is a schematic of a magnetostatic wave delay line.
Figure 4A:
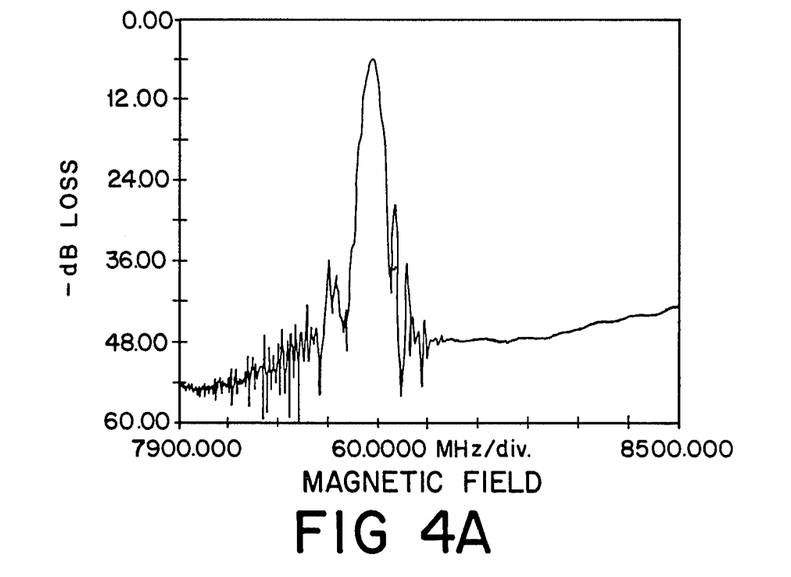
FIG. 4A presents the logarithm of the amplitude of the output signal induced in the output transducer of FIG. 3 as a function of frequency of the signal at the input transducer for a given applied magnetic field.
Figure 4B:
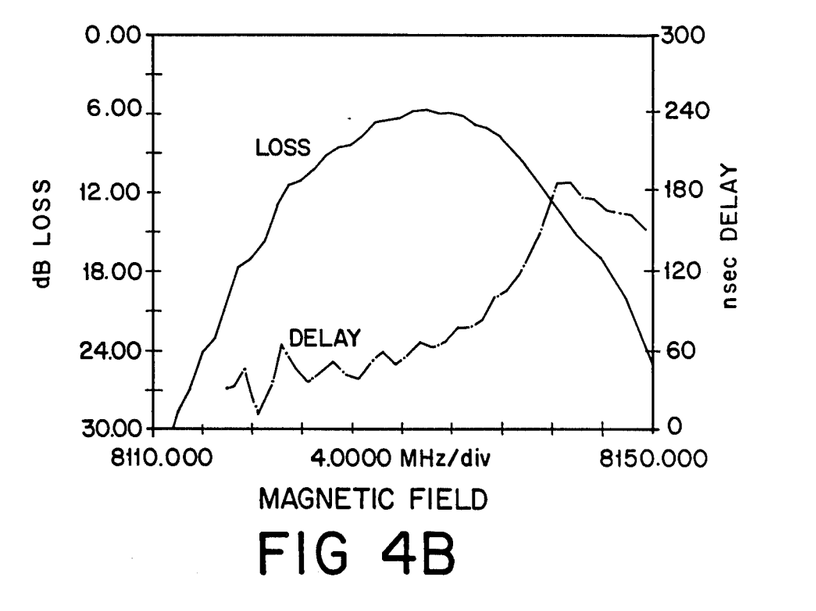
FIG. 4B shows in greater detail the peak of the curve in FIG. 4A.

A current source 36 connected to coil 34 determines the strength of the magnetic field produced by electromagnet 33. The magnetic dipoles in ferrimagnetic film 31 precess around this magnetic field at a precession frequency that increases linearly with the strength of the magnetic field. For infinite wavelength spin waves, the field produced by input transducer 35 couples most strongly to the precessing magnetic dipoles and produces the strongest spin wave when the frequency of the signal to the input transducer equals the precession frequency of the magetic dipoles. Therefore, the frequency of such waves increases linearly with the applied field.

Figure 5:
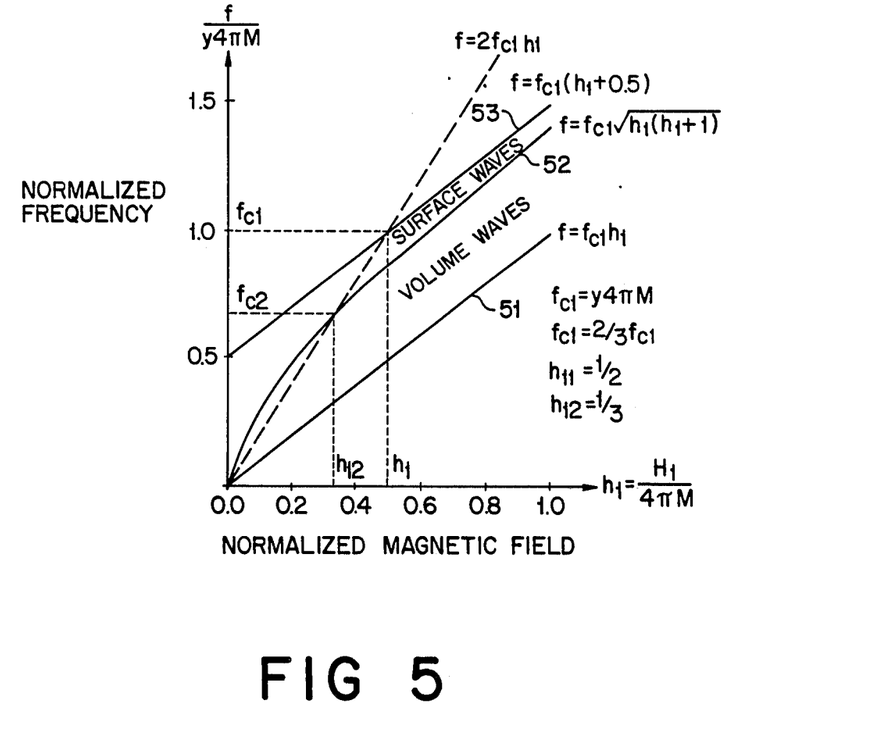
FIG. 5 shows the distribution of frequencies of spin wave states as a function of applied magnetic field $H_i$.
Figure 6A:
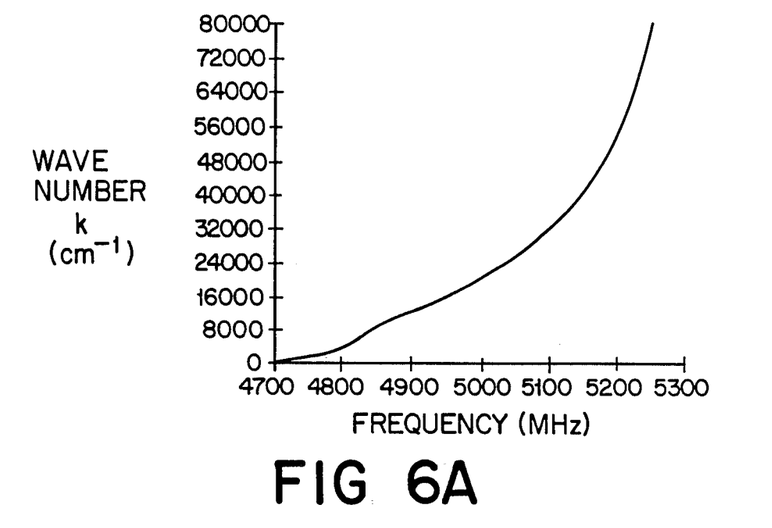
FIG. 6A shows, for a given applied magnetic field, the wave number k of spin waves as a function of the frequency of the spin wave.
Figure 6B:
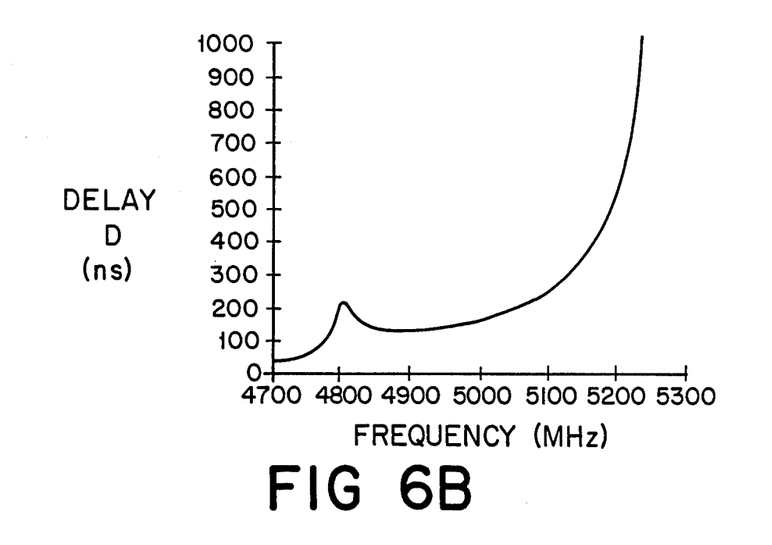
FIG. 6B shows the delay D of a spin wave as a function of the frequency of the spin wave.

In FIG. 5 is shown the distribution of frequencies f of spin wave states as a function of applied magnetic field $H_i$. In that figure, M is the saturation magnetization of the film 31 of ferrimagnetic material and gamma is the gyromagnetic ratio 2.8 MHz/Oersted. At a given value of $h_i$, such as at $h_{i1}$ or at $h_{i2}$, there is a band of frequencies having associated spin wave states that can be excited. At a given value of applied magnetic field, the wave number varies from zero at the bottom of the band (curve 51 for volume waves or curve 52 for surface waves) of frequencies to infinity at the top of the band (curve 52 for volume waves or curve 53 for surface waves) of frequencies. FIG. 6A shows, for a given applied magnetic field, the wave number k of a spin wave as a function of the frequency of the spin wave. In FIG. 6B is the delay D of the magnetostatic wave delay line as a function of frequency f of the spin wave. Delay D is equal to $(L/2\pi)*dk/df$ where L is the length of film 31 between input transducer 35 and output transducer 36. It should be noted that, for the example in FIGS. 6A and 6B, there is a region between 4850 MHz and 5100 MHz in which the delay curve is fairly flat. At other values of applied field, the range will differ, but in general there will be such a range for each value of applied magnetic field typically used.

For a given applied magnetic field, the width of the band of frequencies that can be excited is wider than the 20 MHz band of frequencies about the carrier frequency $f_o$ in which the frequency noise is of interest. However, it is desired to excite only a narrow band of frequencies so that the magnetostatic wave delay line functions as a discriminator to pass only components of the signal under test in a small band about the carrier frequency $f_o$ of the signal under test. In order to narrow the band of frequencies that are excited, multielement transducers 35 and 36 are utilized to select a narrow band of wave numbers that are excited by the the magnetic field produced by the input transducer. Such a multielement transducer consists of a set of parallel conductors having a period equal to the wavelength that is to be selected. The choice of this wavelength is made by use of curves 6A and 6B for the particular magnetostatic wave delay line utilized.

For a given applied field, the frequency at the center of the band of frequencies excited is selected to lie in the middle of the region in which the delay curve of FIG. 6B is flat. With this choice, the delay D is substantially constant across the band of frequencies selected by the discriminator. From this frequency and the curve in FIG. 6A, the wave number k is determined. The period of the multielement transducer is selected to be $2\pi/k$. Elementary grating theory enables the distribution of wavelengths selected to be calculated. In order to have a bandwidth of about 20 MHz, the grating should have at least three elements and preferrably should have four elements. If substantially more than four elements are used, then the input impedance of the input transducer decreases enough that there is a poor match to the fifty ohm impedance that is typically used for the input lines, thereby producing a large insertion loss.

Typically, the applied fields $h_i$ are in the range from 0.5 to 5. In this range, the frequency of a state of a given wave number varies with applied field $h_i$ along a substantially straight line parallel to curves 51 and 53.

Therefore, the frequency of the excited spin waves is a well known function of applied magnetic field. This enables selection of the applied magnetic field that will excite spin waves only in a narrow band about the carrier frequency $f_o$ of the signal under test. Also, over this range of applied fields, the resulting frequencies for the excited states lie within the flat portion of the curve of FIG. 6B.

As shown in FIG. 2, the output of mixer 22 is passed through a low pass filter 26 and a low noise amplifier 27 to a spectrum analyzer for analysis of the signal noise. The low pass filter is not necessary, but improves the rejection of signals outside of the signal band of interest (typically on the order of 20 MHz). Amplifier 27 strengthens the signal for more effective analysis by spectrum analyzer 28. Control circuitry 29 responsive to the output of mixer 22 produces the current I applied to coil 210 that determines the magnitude of the magnetic field applied in magnetostatic wave delay line 25. This current is selected to produce a delay at which the reference channel component is in quadrature with the signal channel component.

An instrument controller, such as computer 211, is responsive to the test data from the spectrum analyzer to analyze the signal noise in the signal under test. This computer is coupled to an output device, such as plotter 212, to output the test data in a form useful to a user. Computer 211 is also coupled to spectrum analyzer 28 and to control circuitry 29 to control the analysis of the output signal $V_o(t)$ and to control the current applied to delay line 25.

Figure 7:
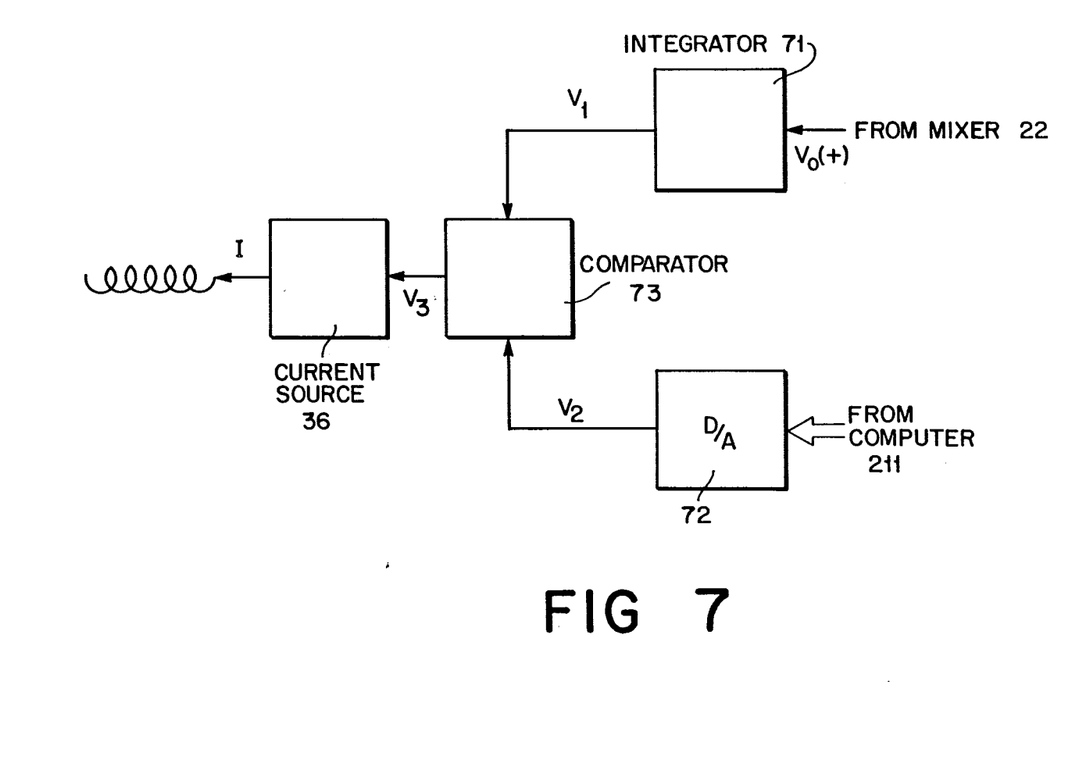
FIG. 7 is a block diagram of the control circuitry of FIG. 1.

Control circuitry 29 is shown in greater detail in FIG. 7. The control circuitry includes an integrator 71 that has an input connected to the output of mixer 22 to integrate the output signal $V_o(t)$. The output voltage $V_1$ from integrator 71 is compared in a comparator 73 to the output voltage $V_2$ of a digital to analog (D/A) converter 72. Voltage $V_2$ is determined by an input from computer 211. This input from the computer is selected to produce a magnetic field in the magnetostatic wave delay line 25 that produces a delay D which sets the reference and signal channel components substantially into quadrature. The output voltage $V_3$ is connected to a current source 36 which produces a current I supplied to coil 210. The integrator has a bandwidth of about one Hertz so that the output voltage of integrator 71 is substantially proportional to the time integral of only the DC component of output signal $V_o(t)$. As shown above, when the signal channel and the reference channel components are not in quadrature, then $V_o(t)$ has a DC component $AK_p\cos(2\pi f_o D)$. In a small range about quadrature between the signal and reference channels, this DC component varies about zero. The choice of polarity of the integrator is selected so that this DC component adjusts the voltage $V_3$ and thereby adjusts the total current I to a value $I_Q$ at which the reference channel component is in quadrature with the signal channel component.

This computer control over the delay D also enables this discriminator to be easily calibrated. From equation (2) above, it is seen that if current I is varied through a range sufficient to vary D through a range greater than $\frac{1}{2}f_o$, then the DC component of $V_o(t)$ (namely, $AK_p\cos(2\pi f_o D)$) varies through values from $-AK_p$ to $AK_p$. Therefore, before a measurement is started and after the condition of quadrature has been established, the computer first opens a switch 213 to inactivate the feedback loop from mixer 22 to coil 210 and then varies the current $I_2$ through a range sufficient to vary D through a range greater than $\frac{1}{2}f_o$. Spectrum analyzer 28 measures the peak to peak change $V_{pp}$ in the DC component of $V_o(t)$ and from this information, computer 211 calculates $K_D$ as $V_{pp}\pi D$.

We claim:

1. A wideband delay line discriminator comprising:
a power divider having an input on which a signal under test is to be applied, a first output on which a signal channel component is produced and a second output on which a reference channel component is produced;
a turnable magnetostatic wave delay line having a multielement input transducer connected to the second output of the power divider and having an output, said transducer having a spatial interval S between the centers of parallel elements, whereby only spin waves having a wavelength in a band about S will be excited, thereby discriminating against frequencies outside of a band centered on a frequency $f_o$;
a phase detector having a first input connected to the first output of the power divider, having a second input connected to the output of the tunable delay line, and having an output on which is produced as output signal proportional to the phase difference between the signals on the inputs of the phase detector.

2. A discriminator as in claim 1 wherein there are a sufficient number of elements that the width of said band centered on $f_o$ is selected to be on the order of 20 MHz.

3. A discriminator as in claim 1 further comprising:
means for tuning the delay of the delay line through a range greater than $\frac{1}{2}f_o$;
means for measuring peak to peak variation of the DC component of a signal on the output of the phase detector as the delay is varied through a range of values; and
means responsive to the value of the delay of the delay line and to the peak to peak variation in the DC component for calculating the discriminator constant.

* * * * *